United States Patent
Luo et al.

(10) Patent No.: US 9,590,595 B2
(45) Date of Patent: Mar. 7, 2017

(54) DRIVER CIRCUIT WITH FEED-FORWARD EQUALIZER

(71) Applicant: MEDIATEK INC., Hsin-Chu (TW)

(72) Inventors: Yan-Bin Luo, Taipei (TW); Chien-Hua Wu, Taipei (TW); Chung-Shi Lin, Hsinchu (TW); Chih-Hsien Lin, Hsinchu County (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/825,149

(22) Filed: Aug. 12, 2015

(65) Prior Publication Data

US 2016/0204768 A1    Jul. 14, 2016

Related U.S. Application Data

(60) Provisional application No. 62/101,064, filed on Jan. 8, 2015.

(51) Int. Cl.
*H03K 17/10*    (2006.01)
*H03K 3/012*    (2006.01)
(Continued)

(52) U.S. Cl.
CPC ..... *H03K 3/012* (2013.01); *H03K 19/017509* (2013.01); *H03K 19/018528* (2013.01);
(Continued)

(58) Field of Classification Search
CPC ..................................................... H03K 17/10
See application file for complete search history.

(56) References Cited

U.S. PATENT DOCUMENTS 6,025,742 A * 2/2000 Chan .............. H03K 19/018528
326/30
6,686,772 B2    2/2004 Li
(Continued)

FOREIGN PATENT DOCUMENTS

CN         1697339 A      11/2005

OTHER PUBLICATIONS

Yan-Bin Luo et al., Title: Driver Circuit for Signal Transmission and Control Method of Driver Circuit, pending U.S. Appl. No. 14/822,913, filed Aug. 11, 2015.
(Continued)

*Primary Examiner* — Hai L Nguyen
(74) *Attorney, Agent, or Firm* — Winston Hsu; Scott Margo

(57) ABSTRACT

A driver circuit for receiving input data and generating an output signal to a termination element is provided, wherein the input data has a first bit and second bit, and the driver circuit includes: a pair of differential output terminals for outputting the output signal, wherein the pair of differential output terminals has a first output terminal and a second output terminal; at least one current mode drive unit, coupled to the pair of differential output terminals, for outputting a current from one of the first output terminal and the second output terminal, and receiving the current from the other of the first output terminal and the second output terminal according to the first bit; and at least one voltage mode drive unit, coupled to the pair of differential output terminals, for providing voltages to the first output terminal and the second output terminal according to the second bit.

20 Claims, 6 Drawing Sheets

(51) Int. Cl.
*H03K 19/0185* (2006.01)
*H04L 25/03* (2006.01)
*H03K 19/0175* (2006.01)

(52) U.S. Cl.
CPC ............... *H03K 19/018585* (2013.01); *H04L 25/03076* (2013.01)

(56) References Cited

U.S. PATENT DOCUMENTS

| | | |
|---|---|---|
| 6,812,733 B1 | 11/2004 | Plasterer |
| 7,012,450 B1 | 3/2006 | Oner |
| 7,298,173 B1 | 11/2007 | Jiang |
| 7,514,968 B1 | 4/2009 | Lai |
| 7,719,314 B1 | 5/2010 | Jiang |
| 7,848,038 B1 | 12/2010 | Tan |
| 7,990,178 B2 | 8/2011 | Liu |
| 8,115,515 B2 | 2/2012 | Roper |
| 8,446,172 B2 | 5/2013 | Chan |
| 8,487,654 B1 | 7/2013 | Chen |
| 9,312,846 B2 * | 4/2016 | Wu ............ H03K 17/16 |
| 2004/0246613 A1 | 12/2004 | Tseng |
| 2006/0208774 A1 | 9/2006 | Leonowich |
| 2006/0290439 A1 | 12/2006 | Martin |
| 2007/0002954 A1 | 1/2007 | Cornelius |
| 2008/0034378 A1 | 2/2008 | Kumar |
| 2009/0203333 A1 | 8/2009 | Jeffries |
| 2012/0299618 A1 | 11/2012 | Sayuk |
| 2013/0076404 A1 | 3/2013 | Lee |
| 2013/0257488 A1 | 10/2013 | Sayuk |
| 2015/0022243 A1 | 1/2015 | Wu |

OTHER PUBLICATIONS

Chien-Hua Wu et al., Title: Drive Circuit for Signal Transmission and Control Method of Driver Circuit, pending U.S. Appl. No. 15/069,880, filed Mar. 14, 2016.

* cited by examiner

DRIVER CIRCUIT WITH FEED-FORWARD EQUALIZER

CROSS REFERENCE TO RELATED APPLICATIONS

This application claims the priority of U.S. Provisional Application No. 62/101,064, filed on Jan. 8, 2015, which is included herein by reference in its entirety.

BACKGROUND

The disclosed embodiments of the present invention relate to signal driving scheme, and more particularly, to a driver circuit used for signal transmission.

Traditional serializer/deserializer (SerDes) designs employ driver circuits including a current mode logic (CML) driver, a voltage mode driver, and an H-bridge current mode driver having a resistor coupled between a differential output terminals (referred to hereinafter as an H-bridge driver). However, the CML driver consumes more power. The voltage mode driver lacks design flexibility and is therefore unsuitable for transmitter (TX) equalizer design. Power efficiency of the H-bridge driver is higher than that of the CML driver but still lower than that of the voltage mode driver.

The application, U.S. application Ser. No. 14/280701, of the same applicant provides a driver circuit having low power consumption and high design flexibility, however, this driver circuit still have power loss at output terminals, and the driver circuit is not allowed to operate as a pulse-amplitude modulation-4 (PAM-4) driver and a non-return-to-zero (NRZ) driver that have different number of output voltage levels.

SUMMARY

It is therefore an objective of the present invention to provide a driver circuit with feed-forward equalizer, which supports PAM-4 and NRZ code and having lower power consumption and high design flexibility, to solve the above-mentioned problems.

According to one embodiment of the present invention, a driver circuit for receiving input data and generating an output signal to a termination element is disclosed, wherein when the driver circuit operates under a first mode, the input data has a first bit and second bit, one of the first bit and the second bit is a most significant bit (MSB), and the other one of the first bit and the second bit is a least significant bit (LSB), and the driver circuit comprises a pair of differential output terminals, a plurality of current mode drive units and at least one voltage mode drive unit. The pair of differential output terminals is arranged for outputting the output signal, wherein the pair of differential output terminals has a first output terminal and a second output terminal; the plurality of current mode drive units are coupled to the pair of differential output terminals and controlled by at least the first bit with different delay amounts, respectively, wherein each of the current mode drive units is arranged for outputting a current from one of the first output terminal and the second output terminal, and receiving the current from the other of the first output terminal and the second output terminal according to the first bit with the corresponding delay amount; the at least one voltage mode drive unit is coupled to the pair of differential output terminals, and is arranged for providing voltages to the first output terminal and the second output terminal according to at least the second bit.

According to another embodiment of the present invention, a driver circuit for receiving input data and generating an output signal to a termination element is disclosed, wherein when the driver circuit operates under a first mode, the input data has a first bit and second bit, one of the first bit and the second bit is a most significant bit (MSB), and the other one of the first bit and the second bit is a least significant bit (LSB), and the driver circuit comprises a pair of differential output terminals, a current mode drive unit and a plurality of voltage mode drive units. The pair of differential output terminals is arranged for outputting the output signal, wherein the pair of differential output terminals has a first output terminal and a second output terminal; the current mode drive unit is coupled to the pair of differential output terminals, and is arranged for outputting a current from one of the first output terminal and the second output terminal, and receiving the current from the other of the first output terminal and the second output terminal according to the first bit; and the plurality of voltage mode drive units are coupled to the pair of differential output terminals and controlled by at least the second bit with different delay amounts, respectively, and each of the voltage mode drive units is arranged for providing voltages to the first output terminal and the second output terminal according to the second bit with the corresponding delay amount.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
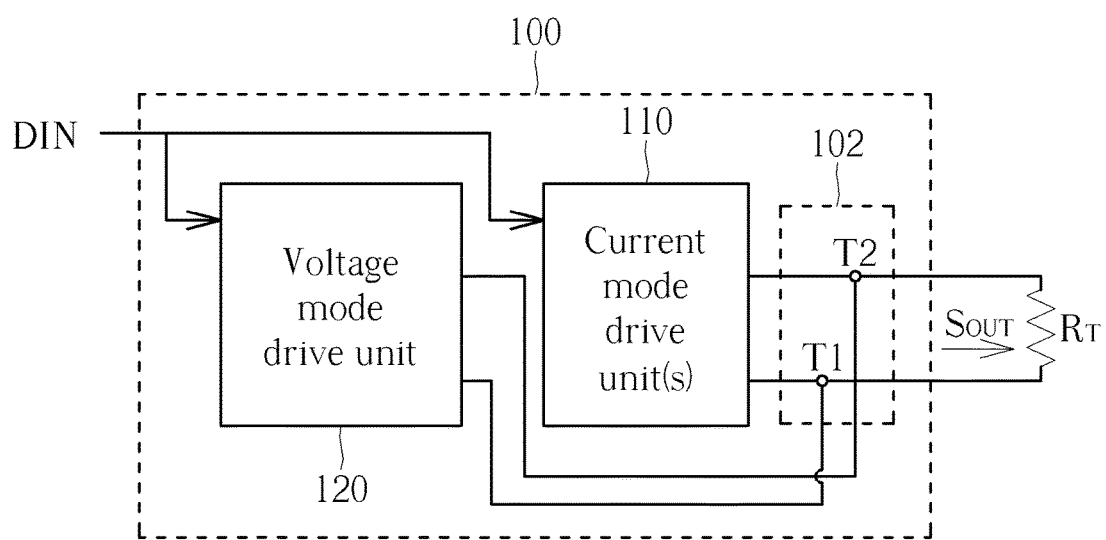
FIG. 1 is a block diagram illustrating an exemplary driver circuit according to an embodiment of the present invention.

Please refer to FIG. 1, which is a block diagram illustrating an exemplary driver circuit 100 according to an embodiment of the present invention. By way of example but not limitation, the driver circuit 100 may be employed in a SerDes transmitter. Specifically, the driver circuit 100 may receive input data DIN and generate an output signal $S_{OUT}$ to a termination element (implemented by a termination resistor $R_T$ in this embodiment), wherein the termination resistor $R_T$ may be located in a SerDes receiver (not shown in FIG. 1). The driver circuit 100 may include a pair of differential output terminals 102 (having an output terminal T1 and an output terminal T2), at least one current mode drive unit 110 and a voltage mode drive unit 120. The output signal $S_{OUT}$ may be regarded as a voltage difference between the output terminal T1 and the output terminal T2, and correspond to an output data logic (e.g. a logic "1" corresponding to a positive voltage or a logic "0" corresponding to a negative voltage in a NRZ mode; or "+1" and "+⅓" corresponding to positive voltages with different levels, and "−⅓" and "−1" corresponding to negative voltages with different levels in a PAM-4 mode).

The current mode drive unit 110 is coupled to the pair of differential output terminals 102, and is arranged for generating a current from one of the output terminal T1 and the output terminal T2 according to the input data DIN, and receive the current from the other of the output terminal T1 and the output terminal T2 according to the input data DIN. Specifically, after the current is outputted from one of the output terminal T1 and the output terminal T2, the current may flow through the termination resistor $R_T$ first, and then flows into the current mode drive unit 110 through the other of the output terminal T1 and the output terminal T2. In other words, the current mode drive unit 110 may change a direction of the current through the termination resistor $R_T$, thereby changing respective electric potentials of the output terminal T1 and the output terminal T2.

The voltage mode drive unit 120 is coupled to the pair of differential output terminals 102, and is arranged for providing voltages to the output terminal T1 and the output terminal T2 according to at least the according to the input data DIN, so that the output terminal T1 and the output terminal T2 may have different electric potentials to provide an output voltage required by the SerDes receiver.

The above is for illustrative purposes only, and is not meant to be a limitation of the present invention. In on implementation, the drive current outputted from the driver circuit 100 may come from the current mode drive unit 110 and the voltage mode drive unit 120. In other words, the drive current outputted from the driver circuit 100 may be a sum of the current and an output current of the voltage mode drive unit 120, wherein a ratio of the current to the drive current outputted from the driver circuit 100 may adjusted according to actual requirements/considerations.

In addition, in this embodiment, the driver circuit 100 is allowed to serve as a PAM-4 driver and a NRZ driver, that is the driver circuit 100 may generate four-level outputs for a PAM-4 mode or generate two-level outputs for a NRZ mode.

Figure 2A:
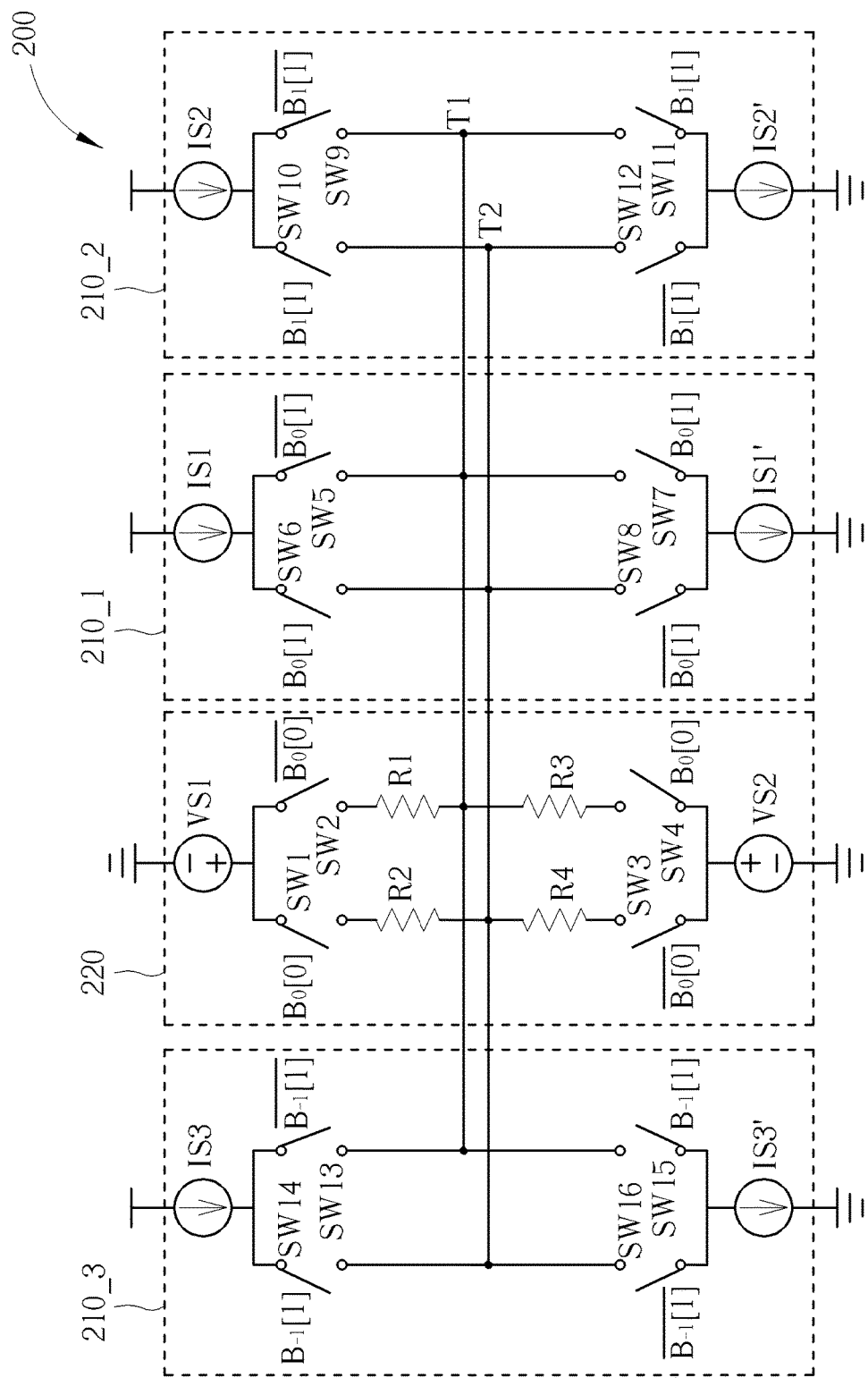
FIG. 2A is a diagram illustrating a driver circuit serving as a PAM-4 driver (i.e. PAM-4 mode) the according to one embodiment of the present invention.

Please refer to FIG. 2A, which is a diagram illustrating a driver circuit 200 serving as a PAM-4 driver (i.e. PAM-4 mode) the according to one embodiment of the present invention. As shown in FIG. 2A, the driver circuit 200 is with 3-tap feed-forward equalizer (FFE), and the driver circuit 200 comprises three current mode drive units 210_1, 210_2 and 210_3, a voltage mode drive unit 220 and a pair of differential output terminals comprising two output terminal T1 and T2, and similar to FIG. 1 the output terminals T1 and T2 connects to the termination element $R_T$. The current mode drive unit 210_1 comprises a current source IS1, a current sink IS1' and a switch module, where the switch module comprises four switches SW5-SW8, and the switches SW5-SW8 are arranged to selectively couple the current source IS1 and the current sink IS1' to the output terminals T1 and T2. The current mode drive unit 210_2 comprises a current source IS2, a current sink IS2' and a switch module, where the switch module comprises four switches SW9-SW12, and the switches SW9-SW12 are arranged to selectively couple the current source IS2 and the current sink IS2' to the output terminals T1 and T2. The current mode drive unit 2103 comprises a current source IS3, a current sink IS3' and a switch module, where the switch module comprises four switches SW13-SW16, and the switches SW13-SW16 are arranged to selectively couple the current source IS3 and the current sink IS3' to the output terminals T1 and T2. The voltage mode drive unit 220 comprises a first voltage source VS1, a second voltage source VS2, a switch module comprising four switches SW1-SW4, and four impedance elements R1-R4, where the switches SW1-SW4 are arranged to selectively couple the first voltage source VS1 and the second voltage source VS2 to the output terminals T1 and T2.

In this embodiment, not a limitation of the present invention, a current provided by the current source IS1 is the same as that of the current sink IS1', a current provided by the current source IS2 is the same as that of the current sink IS2', a current provided by the current source IS3 is the same as that of the current sink IS3', a first reference voltage provided by the first voltage source VS1 is greater than a second reference voltage provided by the second voltage source VS2, and each of the impedance elements R1-R4 has a resistance equal to 50 ohm.

Figure 2B:
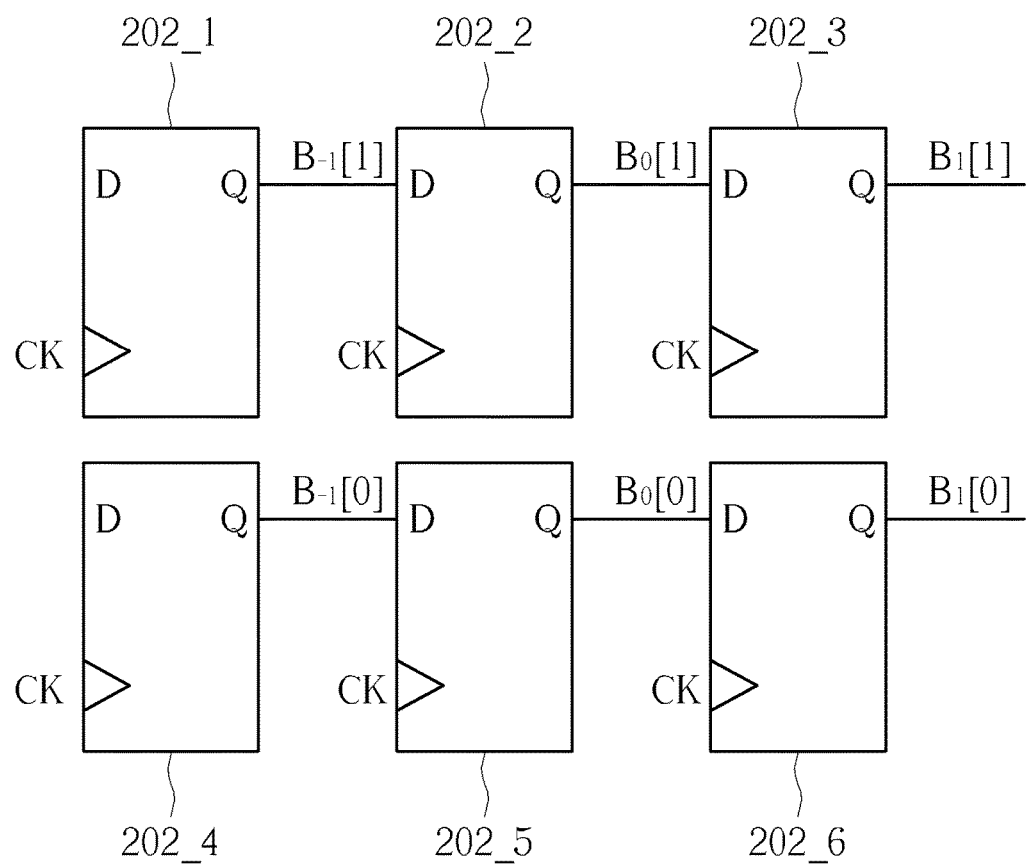
FIG. 2B shows the relationship between the MSB B0[1], B1[1], B-1[1] and LSB B0[0], B1[0], B-1[0].

When the driver circuit 200 serves as the PAM-4 driver, the driver circuit 200 is arranged to receive a most significant bit (MSB) B[1] and a least significant bit (LSB) B[0] to generate an output signal. In FIG. 2, the switches SW2 and SW3 are controlled by the LSB $B_0[0]$, the switches SW1 and SW4 are controlled by an inverted phase of the LSB $B_0[0]$, the switches SW6 and SW7 are controlled by the MSB $B_0[1]$, and the switches SW5 and SW8 are controlled by an inverted phase of the MSB $B_0[1]$, the switches SW10 and SW11 are controlled by the MSB $B_1[1]$, and the switches SW9 and SW12 are controlled by an inverted phase of the MSB $B_1[1]$, the switches SW14 and SW15 are controlled by the MSB $B_{-1}[1]$, and the switches SW13 and SW16 are controlled by an inverted phase of the MSB $B_{-1}[1]$, where when the LSB B[0] or the MSB $B_0[1]$, $B_1[1]$, $B_{-1}[1]$ has a logic value "1", the corresponding switch is switched on; and when the LSB B[0] or the MSB $B_0[1]$, $B_1[1]$, $B_{-1}[1]$ has a logic value "0", the corresponding switch is switched off. Please refer to FIG. 2B, which shows the relationship between the MSB $B_0[1]$, $B_1[1]$, $B_{-1}[1]$ and the LSB $B_0[0]$, $B_1[0]$, $B_{-1}[0]$. As shown in FIG. 2B, there are six delay circuits (three D-type flip-flops 202_1-202_6), and $B_0[1]$, $B_1[1]$, $B_{-1}[1]$ are the MSB with different delay amounts, $B_0[0]$, $B_1[0]$, $B_{-1}[0]$ are the LSB with different delay amounts, and in this field $B_0[1]/B_0[0]$, $B_1[1]/B_1[0]$, $B_{-1}[1]/B_{-1}[0]$ are regarded as main cursor, post-cursor and pre-cursor. By using the circuit structure shown in FIG. 2A, the driver circuit 200 may output four distinct voltage levels corresponding to four combinations $(B_0[1]/B_1[1]/B_{-1}[1], B_0[0])$=(1, 1), (1, 0), (0, 1) and (0, 0), respectively. For example, not a limitation of the present invention, the driver circuit 200 outputs the highest voltage level (e.g. "+1") while $(B_0[1]/B_1[1]/B_{-1}[1], B_0[0])$=(1, 1), the driver circuit 200 outputs the second highest voltage level (e.g. "+(⅓)") while $(B_0[1]/B_1[1]/B_{-1}[1], B_0[0])$=(1, 0), the driver circuit 200 outputs the third highest voltage level (e.g. "−(⅓)") while $(B_0[1]/B_1[1]/B_{-1}[1], B_0[0])$=(0, 1), and the driver circuit 200 outputs the lowest voltage level (e.g. "−1") while $(B_0[1]/B_1[1]/B_{-1}[1], B_0[0])=(0, 0)$.

When the driver circuit 200 serves as the NRZ driver (i.e. NRZ mode), there are only two types of input data: $(B_0[1]/B_1[1]/B_{-1}[1], B[0])=(1, 1)$ and $(B_0[1]/B_1[1]/B_{-1}[1], B[0])=(0, 0)$, that is the MSB B[1] is equal to the LSB B[0]. In the NRZ mode, the driver circuit 200 outputs the high voltage level (e.g. "+1") while (MSB, LSB)=(1, 1), and the driver circuit 200 outputs the low voltage level (e.g. "−1") while (MSB, LSB)=(0, 0).

In this embodiment, the driver circuit 200 is with 3-tap feed-forward equalizer, so there are three current mode drive units 210_1, 210_2 and 210_3. In other embodiments, however, the quantity of the current mode drive units may be changed according to the FFE tap number designed by the engineer (e.g. five current mode drive units for 5-tap FFE), and the quantity of the pre-cursors or post-cursors may be changed according to designer's consideration.

In the embodiment shown in FIG. 2A, the plurality of current mode drive units 210_1, 210_2 and 210_3 are used to implement the FFE, but the voltage mode drive unit 220 merely receives the main cursor B0[0]. In other embodiments, the driver circuit 200 can be modified to have three voltage mode drive units 220 controlled by the $B_0[0]$, $B_1[0]$ and $B_{-1}[0]$, respectively, and each of three voltage mode drive units is arranged for providing voltages to the output terminals T1 and T2 according to the LSB B[0] with the corresponding delay amount, that is the voltage mode drive units are also used to implement the FFE. In another embodiment, the driver circuit 200 can be modified to have three voltage mode drive units 220 controlled by the $B_0[0]$, $B_1[0]$ and $B_{-1}[0]$, respectively, but the current mode drive units 210 2 and 210 3 are removed from the driver circuit 200, that is three voltage mode drive units are used to implement the FFE, but the current mode drive unit 210 1 merely receives the main cursor B1[0]. These alternative designs shall fall within the scope of the present invention.

In addition, in the embodiment shown in FIG. 2A, the current mode drive units 210_1-210_3 receives the MSB B[1] with different delay amounts, and the voltage mode drive unit 220 receives the LSB B[0], however, in another embodiment of the present invention, the current mode drive units 210_1-210_3 may receive the LSB B[0] while the voltage mode drive unit 220 receives the MSB B[1], that is the symbols $B_0[0]$, $B_0[1]$, $B_1[1]$, $B_{-1}[1]$ are replaced by $B_0[1]$, $B_0[0]$, $B_1[0]$, $B_{-1}[0]$. Moreover, similar to the alternative embodiments described in the previous paragraph, besides the exchange of the MSB and LSB, the driver circuit may be modified to make the voltage mode drive units are used to implement the FFE, or the current mode drive unit 210_1 merely receives the main cursor. These alternative designs shall fall within the scope of the present invention.

Figure 3A:
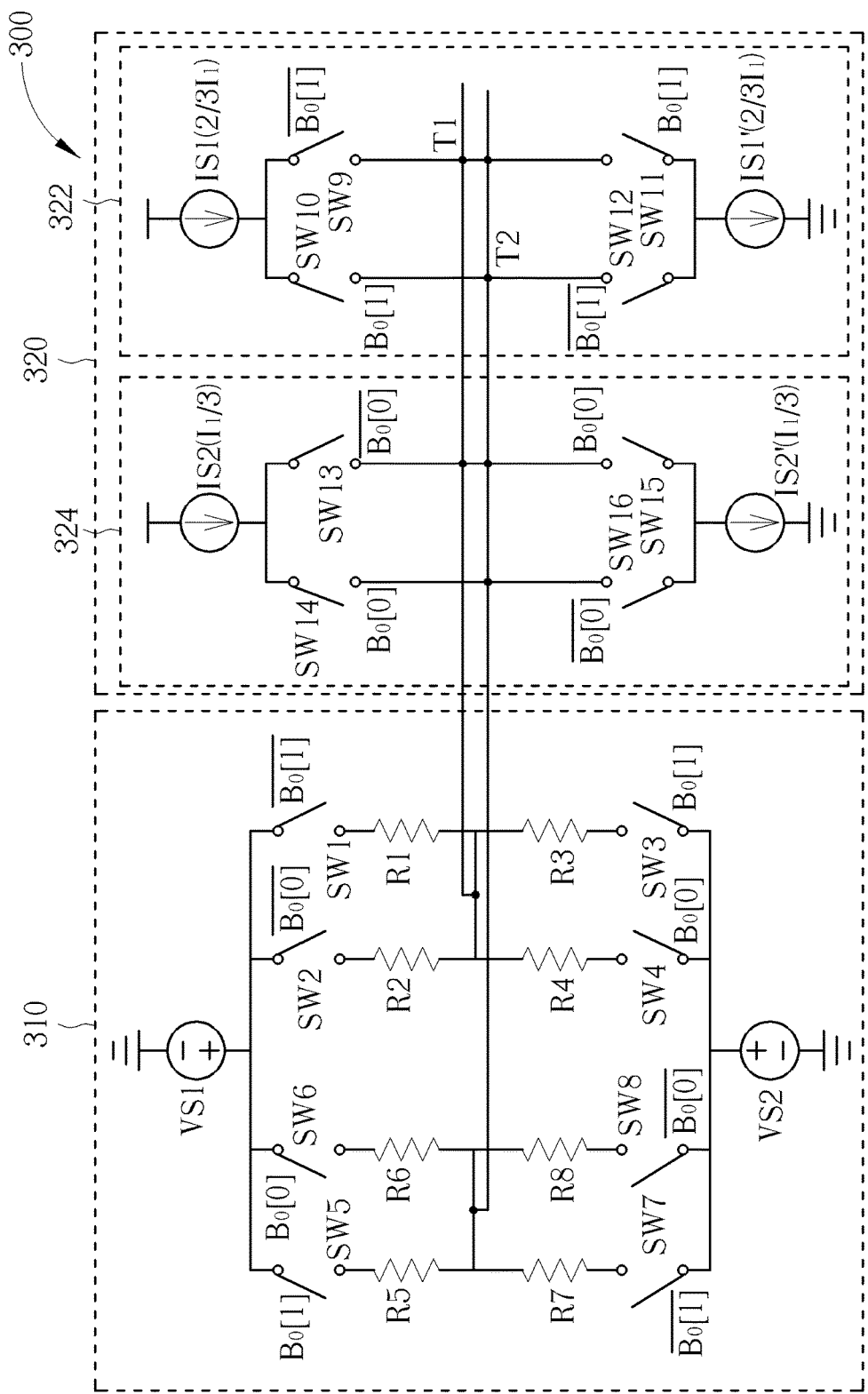
FIG. 3A and FIG. 3B, which is a diagram illustrating a driver circuit serving as a PAM-4 driver the according to another embodiment of the present invention.
Figure 3B:
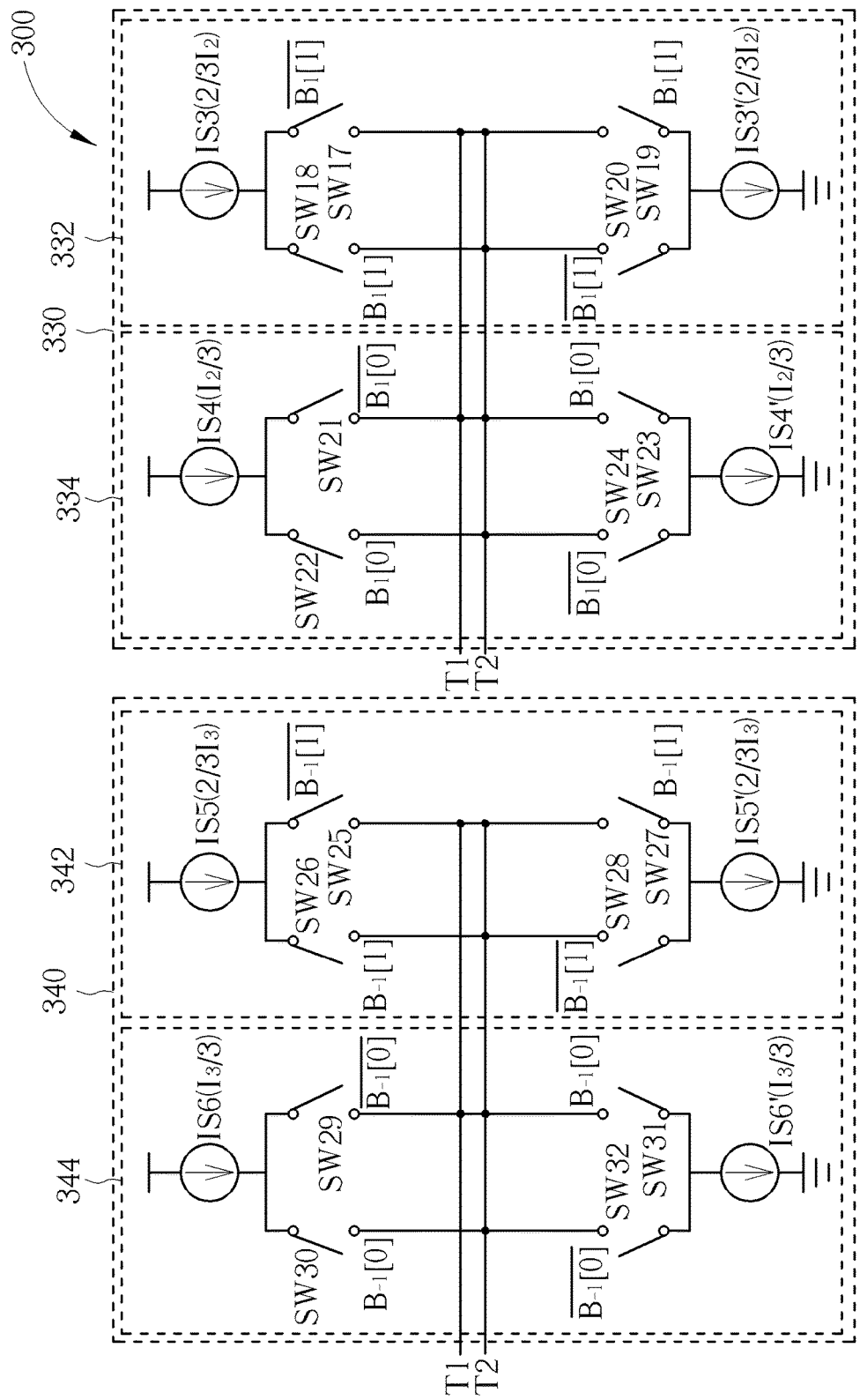

Please refer to FIG. 3A and FIG. 3B, which is a diagram illustrating a driver circuit 300 serving as a PAM-4 driver the according to another embodiment of the present invention. As shown in FIG. 3, the driver circuit 300 is with 3-tap feed-forward equalizer (FFE), and the driver circuit 300 comprises a voltage mode drive unit 310 and three current mode drive units 320, 330 and 340, and a pair of differential output terminals comprising two output terminal T1 and T2, where the output terminals T1 and T2 connects to the termination element $R_T$ as shown in FIG. 1. The voltage mode drive unit 310 comprises a first voltage source VS1, a second voltage source VS2, a switch module comprising eight switches SW1-SW8, a first impedance circuit mode comprising four impedance elements R1-R4, and a second impedance circuit mode comprising four impedance elements R5-R8, where the switches SW1-SW8 are arranged to selectively couple the first voltage source VS1 and the second voltage source VS2 to the output terminals T1 and T2. The current mode drive unit 320 comprises a first sub-drive unit 322 and a second sub-drive unit 324, where the first sub-drive unit 322 comprises a first current source IS1, a first current sink IS1' and a first switch module, where the first switch module comprises four switches SW9-SW12, and the switches SW9-SW12 are arranged to selectively couple the first current source IS1 and the first current sink IS1' to the output terminals T1 and T2; and the second sub-drive unit 324 comprises a second current source IS2, a second current sink IS2' and a second switch module, where the second switch module comprises four switches SW13-SW16, and the switches SW13-SW16 are arranged to selectively couple the second current source IS2 and the second current sink IS2' to the output terminals T1 and T2. The current mode drive unit 330 comprises a first sub-drive unit 332 and a second sub-drive unit 334, where the first sub-drive unit 332 comprises a third current source IS3, a third current sink IS3' and a third switch module, where the third switch module comprises four switches SW17-SW20, and the switches SW17-SW20 are arranged to selectively couple the third current source IS3 and the third current sink IS3' to the output terminals T1 and T2; and the second sub-drive unit 334 comprises a fourth current source IS4, a fourth current sink IS4' and a fourth switch module, where the fourth switch module comprises four switches SW21-SW24, and the switches SW21-SW24 are arranged to selectively couple the fourth current source IS4 and the fourth current sink IS4' to the output terminals T1 and T2. The current mode drive unit 340 comprises a first sub-drive unit 342 and a second sub-drive unit 344, where the first sub-drive unit 342 comprises a fifth current source IS5, a fifth current sink IS5' and a fifth switch module, where the fifth switch module comprises four switches SW25-SW28, and the switches SW25-SW28 are arranged to selectively couple the fifth current source IS5 and the fifth current sink IS5' to the output terminals T1 and T2; and the second sub-drive unit 344 comprises a sixth current source IS6, a sixth current sink IS6' and a sixth switch module, where the sixth switch module comprises four switches SW29-SW32, and the switches SW29-SW32 are arranged to selectively couple the sixth current source IS6 and the sixth current sink IS6' to the output terminals T1 and T2.

In this embodiment, a current provided by the first current source IS1 and the first current sink IS1' is equal to $(2/3)*I_1$, a current provided by the second current source IS2 and the second current sink IS2' is equal to $(1/3)*I_1$, a current provided by the third current source IS3 and the third current sink IS3' is equal to $(2/3)*I_2$, a current provided by the fourth current source IS4 and the fourth current sink IS4' is equal to $(1/3)*I_2$, a current provided by the fifth current source IS5 and the fifth current sink IS1' is equal to $(2/3)*I_3$, a current provided by the sixth current source IS6 and the sixth current sink IS6' is equal to $(1/3)*I_3$, where "$I_1$", "$I_2$" and "$I_3$" can be any suitable current values. In addition, a first reference voltage provided by the first voltage source VS1 is greater than a second reference voltage provided by the second voltage source VS2; and each of the impedance elements R1, R3, R5 and R7 has a resistance equal to 75 ohm, and each of the impedance elements R2, R4, R6 and R8 has a resistance equal to 150 ohm. It is noted that the above arrangements are for illustrative purposes only, not limitations of the present invention.

When the driver circuit 300 serves as the PAM-4 driver, the driver circuit 300 is arranged to receive a most significant bit (MSB) B[1] and a least significant bit (LSB) B[0] to generate an output signal. In FIG. 3, for the voltage mode drive unit 310 and the current mode drive unit 320, the switches SW4, SW6, SW14 and SW15 are controlled by the LSB B0[0], the switches SW2, SW8, SW13 and SW 16 are controlled by an inverted phase of the LSB $B_0$[0], the switches SW3, SW5, SW10 and SW11 are controlled by the MSB $B_0$[1], and the switches SW1, SW7, SW9 and SW12 are controlled by an inverted phase of the MSB $B_0$[1]; for the current mode drive unit 330, the switches SW22 and SW23 are controlled by the LSB $B_1$[0], the switches SW21 and SW24 are controlled by an inverted phase of the LSB $B_1$[0], the switches SW18 and SW19 are controlled by the MSB $B_1$[1], and the switches SW17 and SW20 are controlled by an inverted phase of the MSB $B_1$[1]; for the current mode drive unit 340, the switches SW30 and SW31 are controlled by the LSB $B_{-1}$[0], the switches SW29 and SW32 are controlled by an inverted phase of the LSB $B_{-1}$[0], the switches SW26 and SW27 are controlled by the MSB $B_{-1}$[1], and the switches SW25 and SW28 are controlled by an inverted phase of the MSB $B_{-1}$[1], where when the LSB B[0] or the MSB $B_0$[1], $B_1$[1], $B_{-1}$[1] has a logic value "1", the corresponding switch is switched on; and when the LSB B[0] or the MSB $B_0$[1], $B_1$[1], $B_{-1}$[1] has a logic value "0", the corresponding switch is switched off. The relationship between the MSB $B_0$[1], $B_1$[1], $B_{-1}$[1] is shown in FIG. 2B, $B_0$[1], $B_1$[1], $B_{-1}$[1] are the MSB with different delay amounts, $B_0$[0], $B_1$[0], $B_{-1}$[0] are the LSB with different delay amounts, and in this field $B_0$[1]/$B_0$[0], $B_1$[1]/$B_1$[0], $B_{-1}$[1]/$B_{-1}$[0] are regarded as main cursor, post-cursor and pre-cursor. By using the circuit structure shown in FIG. 3, the driver circuit 300 may output four distinct voltage levels corresponding to four combinations ($B_0$[1]/$B_1$[1]/$B_{-1}$[1], B0[0])=(1, 1), (1, 0), (0, 1) and (0, 0), respectively. For example, not a limitation of the present invention, the driver circuit 300 outputs the highest voltage level (e.g. "+1") while ($B_0$[1]/$B_1$[1]/$B_{-1}$[1], B0[0])=(1, 1), the driver circuit 300 outputs the second highest voltage level (e.g. "+(⅓)") while ($B_0$[1]/$B_1$[1]/$B_{-1}$[1], B0[0])=(1, 0), the driver circuit 300 outputs the third highest voltage level (e.g. "−(⅓)") while ($B_0$[1]/$B_1$[1]/$B_{-1}$[1], B0[0])=(0, 1), and the driver circuit 300 outputs the lowest voltage level (e.g. "−1") while ($B_0$[1]/$B_1$[1]/$B_{-1}$[1], B0[0])=(0, 0).

When the driver circuit 300 serves as the NRZ driver (i.e. NRZ mode), there are only two types of input data: ($B_0$[1]/$B_1$[1]/$B_{-1}$[1], $B_0$[0])=(1, 1) and ($B_0$[1]/$B_1$[1]/$B_{-1}$[1], $B_0$[0])= (0, 0), that is the MSB B[1] is equal to the LSB B[0]. In the NRZ mode, the driver circuit 300 outputs the high voltage level (e.g. "+1") while (MSB, LSB)=(1, 1), and the driver circuit 300 outputs the low voltage level (e.g. "−1") while (MSB, LSB)=(0, 0).

Figure 4:
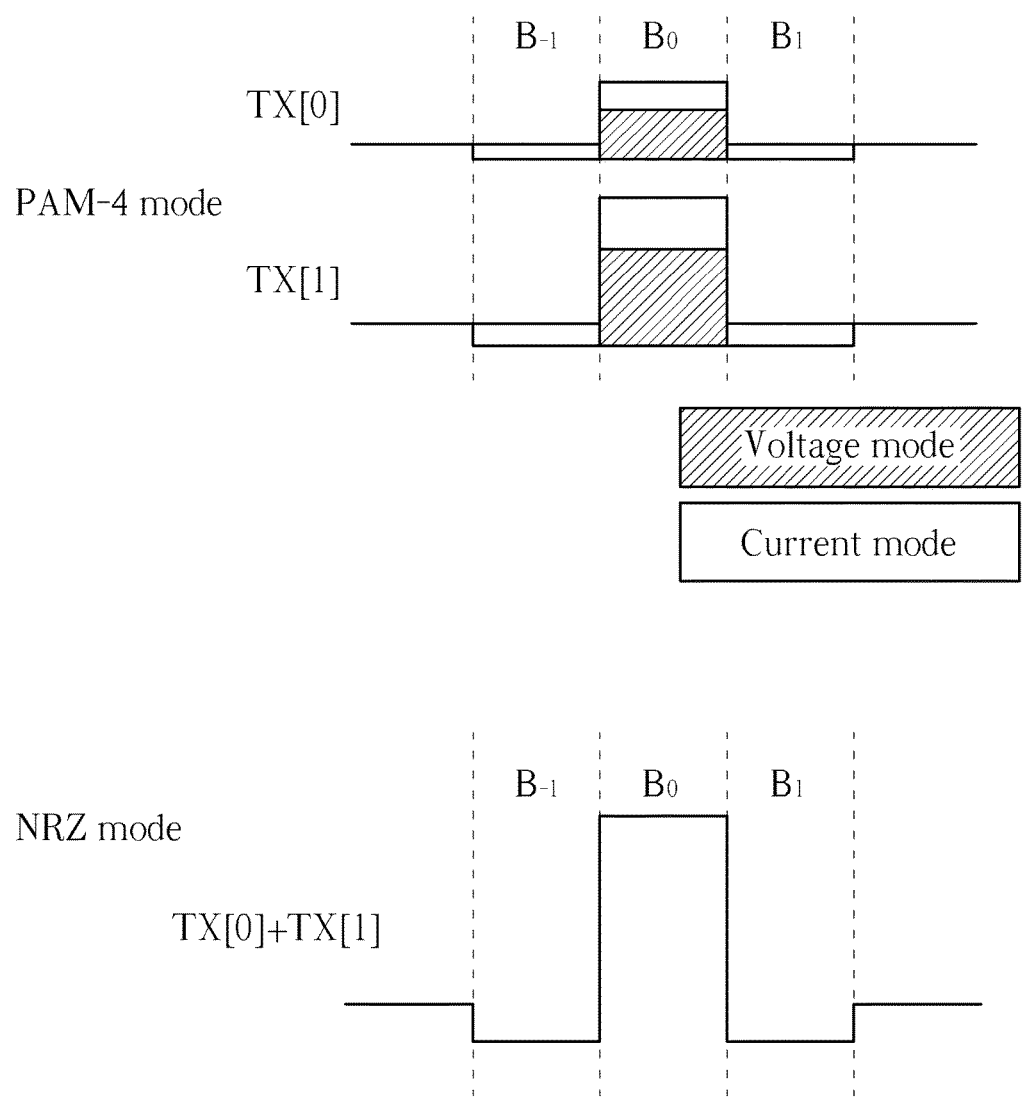
FIG. 4 shows the operation concept of the driver circuit operating in the PAM-4 mode and the NRZ mode.

FIG. 4 shows the operation concept of the driver circuit 300 operating in the PAM-4 mode and the NRZ mode. Refer to FIG. 4, TX[0] is an output level contributed by the LSB B[0], and TX[1] is an output level contributed by the MSB B[1] (comprising voltage mode and current mode), and TX[0] and TX[1] is summed to configure the NRZ mode.

In this embodiment, the driver circuit 300 is with 3-tap feed-forward equalizer, so there are three current mode drive units 320, 330 and 340. In other embodiments, however, the quantity of the current mode drive units may be changed according to the FFE tap number designed by the engineer (e.g. five current mode drive units for 5-tap FFE), and the quantity of the pre-cursors or post-cursors may be changed according to designer's consideration.

In the embodiment shown in FIG. 3, the plurality of current mode drive units 320, 330 and 340 are used to implement the FFE, but the voltage mode drive unit 310 merely receives the main cursor B0[0]. In other embodiments, the driver circuit 300 can be modified to have three voltage mode drive units 310 controlled by $B_0$[0], $B_1$[0] and $B_{-1}$[0], respectively, and each of three voltage mode drive units is arranged for providing voltages to the output terminals T1 and T2 according to the LSB B[0] with the corresponding delay amount, that is the voltage mode drive units are also used to implement the FFE. In another embodiment, the driver circuit 300 can be modified to have three voltage mode drive units 320 controlled by the $B_0$[0], $B_1$[0] and $B_{-1}$[0], respectively, but the current mode drive units 330 and 340 are removed from the driver circuit 300, that is three voltage mode drive units are used to implement the FFE, but the current mode drive unit 320 merely receives the main cursor $B_1$[0]. These alternative designs shall fall within the scope of the present invention.

In the embodiments shown in FIG. 2A, the current mode drive unit 210_1-210_3 receive the MSB while the voltage mode drive unit 220 receives the LSB; and in the embodiments shown in FIG. 3, the current mode drive units 320, 330 and 340 receive both MSB and LSB while the voltage mode drive unit 310 receives both MSB and LSB. However, the driver circuit may also be implemented by modifying or combining the above-mentioned embodiments. For example, in a fourth embodiment of the present invention, the current mode drive unit(s) may receive MSB or LSB while the voltage mode drive unit(s) receives both MSB and LSB, where FFE may be implemented by the current mode drive units, the voltage mode drive units, or the both; and in a fifth embodiment of the present invention, the current mode drive unit(s) may receive both MSB and LSB while the voltage mode drive unit(s) receives MSB or LSB, where FFE maybe implemented by the current mode drive units, the voltage mode drive units, or the both. Because a person skilled in the art should understand how to implement the fourth embodiment and the fifth embodiment after reading the aforementioned disclosure, further descriptions are omitted here.

Briefly summarized, in the driver circuit of the present invention, the driver circuit can serve as a PAM-4 driver or a NRZ driver to support PAM-4 and NRZ codes, and further be implemented with FFE. Furthermore, the driver circuit of the present invention has lower power consumption and high design flexibility.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A driver circuit for receiving input data and generating an output signal to a termination element, wherein when the driver circuit operates under a first mode, the input data has a first bit and second bit, one of the first bit and the second bit is a most significant bit (MSB), and the other one of the first bit and the second bit is a least significant bit (LSB), and the driver circuit comprises:

a pair of differential output terminals, arranged for outputting the output signal, wherein the pair of differential output terminals has a first output terminal and a second output terminal;

a plurality of current mode drive units, coupled to the pair of differential output terminals and controlled by at least the first bit with different delay amounts, respectively, wherein each of the current mode drive units is arranged for outputting a current from one of the first output terminal and the second output terminal, and receiving the current from the other of the first output terminal and the second output terminal according to the first bit with the corresponding delay amount; and at least one voltage mode drive unit, coupled to the pair of differential output terminals, for providing voltages to the first output terminal and the second output terminal according to at least the second bit.

2. The driver circuit of claim 1, wherein one of the first current mode drive units comprises:
   a current source;
   a current sink; and
   a switch module, coupled between the current source and the pair of differential output terminals, and coupled between the current sink and the pair of differential output terminals;
   wherein the current source is coupled to one of the first output terminal and the second output terminal via the switch module according to the first bit, and the current sink is coupled to the other one of the first output terminal and the second output terminal via the switch module according to the first bit.

3. The driver circuit of claim 1, wherein the at least one voltage mode drive unit comprises:
   a first voltage source, for providing a first reference voltage;
   a second voltage source, for providing a second reference voltage; and
   a switch module, coupled between the first voltage source and the pair of differential output terminals, and coupled between the second voltage source and the pair of differential output terminals;
   wherein the first voltage source is coupled to one of the first output terminal and the second output terminal via the switch module according to the second bit, and the second voltage source is coupled to the other one of the first output terminal and the second output terminal via the switch module according to the second bit.

4. The driver circuit of claim 1, wherein the current mode drive units are controlled by the first bit with different delay amounts and the second bit with different delay amounts, respectively, and each of the current mode drive units is arranged for outputting the current from one of the first output terminal and the second output terminal, and receiving the current from the other of the first output terminal and the second output terminal according to the first bit and the second bit with the corresponding delay amount.

5. The driver circuit of claim 4, wherein one of the current mode drive units comprises a first sub-drive unit and a second sub-drive unit, and
   the first sub-drive unit comprises:
   a first current source;
   a first current sink; and
   a first switch module, coupled between the first current source and the pair of differential output terminals, and coupled between the first current sink and the pair of differential output terminals; and
   the second sub-drive unit comprises:
   a second current source;
   a second current sink; and
   a second switch module, coupled between the second current source and the pair of differential output terminals, and coupled between the second current sink and the pair of differential output terminals;
   wherein the first current source is coupled to one of the first output terminal and the second output terminal via the first switch module according to the second bit, and the first current sink is coupled to the other one of the first output terminal and the second output terminal via the first switch module according to the second bit; and the second current source is coupled to one of the first output terminal and the second output terminal via the second switch module according to the first bit, and the second current sink is coupled to the other one of the first output terminal and the second output terminal via the second switch module according to the first bit.

6. The driver circuit of claim 1, wherein the voltage mode drive unit provides the voltages to the first output terminal and the second output terminal according to both the first bit and the second bit.

7. The driver circuit of claim 6, wherein the voltage mode drive unit comprises:
   a first voltage source, for providing a first reference voltage;
   a second voltage source, for providing a second reference voltage;
   a switch module, coupled between the first voltage source and the pair of differential output terminals, and coupled between the second voltage source and the pair of differential output terminals;
   a first impedance circuit module, coupled between the switch module and the first output terminal; and
   a second impedance circuit module, coupled between the switch module and the second output terminal.

8. The driver circuit of claim 7, wherein
   the first impedance circuit module comprises:
   a first impedance element, coupled between the first voltage source and the first output terminal;
   a second impedance element, coupled between the first voltage source and the first output terminal;
   a third impedance element, coupled between the second voltage source and the first output terminal; and
   a fourth impedance element, coupled between the second voltage source and the first output terminal; and
   the second impedance circuit module comprises:
   a fifth impedance element, coupled between the first voltage source and the second output terminal;
   a sixth impedance element, coupled between the first voltage source and the second output terminal;
   a seventh impedance element, coupled between the second voltage source and the second output terminal; and
   an eighth impedance element, coupled between the second voltage source and the second output terminal.

9. The driver circuit of claim 8, wherein the first voltage source is selectively coupled to the first impedance element or the fifth impedance element according to the second bit, the first voltage source is selectively coupled to the second impedance element or the sixth impedance element according to the first bit, the second voltage source is selectively coupled to the third impedance element or the seventh impedance element according to the second bit, and the second voltage source is selectively coupled to the fourth impedance element or the eighth impedance element according to the first bit.

10. The driver circuit of claim 8, wherein the current mode drive units are controlled by the first bit with different delay amounts and the second bit with different delay amounts, respectively, and one of the current mode drive units comprises a first sub-drive unit and a second sub-drive unit, and the first sub-drive unit comprises:
  a first current source;
  a first current sink; and
  a first switch module, coupled between the first current source and the pair of differential output terminals, and coupled between the first current sink and the pair of differential output terminals; and
the second sub-drive unit comprises:
  a second current source;
  a second current sink; and
  a second switch module, coupled between the second current source and the pair of differential output terminals, and coupled between the second current sink and the pair of differential output terminals;
wherein the first current source is coupled to one of the first output terminal and the second output terminal via the first switch module according to the second bit, and the first current sink is coupled to the other one of the first output terminal and the second output terminal via the first switch module according to the second bit; and the second current source is coupled to one of the first output terminal and the second output terminal via the second switch module according to the first bit, and the second current sink is coupled to the other one of the first output terminal and the second output terminal via the second switch module according to the first bit.

11. The driver circuit of claim 10, wherein a current provided by the first current source is twice that of the second current source; and resistances of the second impedance element, fourth impedance element, sixth impedance element and eighth impedance element are twice that of the first impedance element, third impedance element, fifth impedance element and seventh impedance element, respectively.

12. The driver circuit of claim 1, wherein the driver circuit comprises a plurality of voltage mode drive units coupled to the pair of differential output terminals and controlled by at least the second bit with different delay amounts, respectively, and each of the voltage mode drive units is arranged for providing voltages to the first output terminal and the second output terminal according to the second bit with the corresponding delay amount.

13. The driver circuit of claim 12, wherein the at least one voltage mode drive unit comprises:
  a first voltage source, for providing a first reference voltage;
  a second voltage source, for providing a second reference voltage; and
  a switch module, coupled between the first voltage source and the pair of differential output terminals, and coupled between the second voltage source and the pair of differential output terminals;
wherein the first voltage source is coupled to one of the first output terminal and the second output terminal via the switch module according to the second bit, and the second voltage source is coupled to the other one of the first output terminal and the second output terminal via the switch module according to the second bit.

14. The driver circuit of claim 13, wherein one of the voltage mode drive unit provides the voltages to the first output terminal and the second output terminal according to both the first bit and the second bit.

15. The driver circuit of claim 1, wherein the first mode is a pulse-amplitude modulation-4 (PAM-4) mode, and the driver circuit further supports a non-return-to-zero (NRZ) mode.

16. The driver circuit of claim 15, wherein when the driver circuit operates under the NRZ mode, the first bit and the second bit have a same value.

17. A driver circuit for receiving input data and generating an output signal to a termination element, wherein when the driver circuit operates under a first mode, the input data has a first bit and second bit, one of the first bit and the second bit is a most significant bit (MSB), and the other one of the first bit and the second bit is a least significant bit (LSB), and the driver circuit comprises:
  a pair of differential output terminals, arranged for outputting the output signal, wherein the pair of differential output terminals has a first output terminal and a second output terminal;
  a current mode drive unit, coupled to the pair of differential output terminals, for outputting a current from one of the first output terminal and the second output terminal, and receiving the current from the other of the first output terminal and the second output terminal according to the first bit; and
  a plurality of voltage mode drive units, coupled to the pair of differential output terminals and controlled by at least the second bit with different delay amounts, respectively, and each of the voltage mode drive units is arranged for providing voltages to the first output terminal and the second output terminal according to the second bit with the corresponding delay amount.

18. The driver circuit of claim 17, wherein one of the voltage mode drive unit provides the voltages to the first output terminal and the second output terminal according to both the first bit and the second bit.

19. The driver circuit of claim 17, wherein the first mode is a pulse-amplitude modulation-4 (PAM-4) mode, and the driver circuit further supports a non-return-to-zero (NRZ) mode.

20. The driver circuit of claim 19, wherein when the driver circuit operates under the NRZ mode, the first bit and the second bit have a same value.

* * * * *